United States Patent [19]

Byell et al.

[11] Patent Number: 5,097,386
[45] Date of Patent: Mar. 17, 1992

[54] ELECTRONIC APPARATUS MOUNTING

[75] Inventors: Horst Byell, Garbsen; Erik Leidel, Langenhagen, both of Fed. Rep. of Germany

[73] Assignee: Sensycon Gesellschaft für Industrielle Sensorsysteme und Processleittechnik mbH, Hanover, Fed. Rep. of Germany

[21] Appl. No.: 593,232

[22] Filed: Oct. 5, 1990

[30] Foreign Application Priority Data

Oct. 6, 1989 [DE] Fed. Rep. of Germany ....... 3933319

[51] Int. Cl.$^5$ .............................................. H05K 7/20
[52] U.S. Cl. ................................... 361/384; 361/391; 361/395
[58] Field of Search ............... 361/331, 340, 342, 359, 361/380, 390, 391, 395, 399

[56] References Cited

U.S. PATENT DOCUMENTS

| 3,188,524 | 6/1965 | Williams | 361/391 |
| 4,268,100 | 5/1981 | Kekas et al. | 361/391 |
| 4,523,254 | 6/1985 | Konshak | 361/391 |
| 4,972,296 | 11/1990 | Chu | 361/391 |

Primary Examiner—Gregory D. Thompson
Attorney, Agent, or Firm—Martin A. Farber

[57] ABSTRACT

A mounting for installation of electronic apparatus in switchboards or consoles has a shell-like housing 1 with front-side opening 2 which can be closed by a cover panel 3. Approximately parallel to the bottom surface of the housing 1, a first circuit board 7 is arranged in the housing onto which circuit board at least one additional circuit board 9 which extends approximately vertically upward and possibly bears electronic components can be plugged, establishing an electric connection to the first circuit board 7. The first circuit board 7 and the additional circuit boards 9 can be arranged on a circuit-board holder 6. The lines which lead to external units can be connected to plug connections 10 which are connected in electrically conductive manner to the first circuit board 7. The circuit-board holder 6 is arranged on the housing 1 swingable around a pivot shaft 5 in the region of one edge of the front-side opening 2 of the housing 1 and can be swung out of its installed position around the pivot shaft 5 out of the housing 1.

21 Claims, 2 Drawing Sheets

ELECTRONIC APPARATUS MOUNTING

FIELD AND BACKGROUND OF THE INVENTION

The present invention relates to a mounting or holder for installation electronic apparatus in switchboards or consoles, the mounting having a shell-like housing with one front-side opening which can be closed off by a cover panel. The electronic apparatus includes a first circuit board which is arranged in the housing, approximately parallel to the bottom surface of the housing and on which at least one additional circuit board which extends approximately vertically upward and possibly bears electronic components can be plugged. The additional board is electrically connected to the first circuit board, the first and additional circuit boards being possible arranged on a circuit-board holder, with plug connections which are connected to the first circuit board in electrically conductive manner and to which lines which lead to external units can be connected.

In such electronic apparatus mountings it is extremely expensive, for instance, to remove the additional circuit board from the housing in order to replace it or to install further additional circuit boards by way of expansion. On the one hand, the circuit boards are in most cases arranged in the housing in a difficultly accessible manner and, on the other hand, it is frequently necessary to remove other components arranged in front of the circuit boards which are to be replaced or added.

This requires not only a considerable expense for installation but also easily leads to the damaging of other components.

SUMMARY OF THE INVENTION

It is therefore the object of the present invention to create an electronic apparatus mounting of the type described above which makes simple installation and removal of circuit boards possible.

This object is achieved in accordance with the invention in the manner that the circuit-board holder is arranged swingable around a pivot shaft on the housing in the region of one edge of the front-side opening of the housing and can be swung out of its installed position around the pivot shaft out of the housing. Due to the swingability of the circuit-board holder and the arrangement of the pivot shaft in the region of the front-side opening of the housing, the circuit-board holder can be swung at least substantially out of the housing so that all circuit boards are freely accessible. The installing or removal of other components is not required when circuit boards are added or replaced. Damage to other components is also substantially avoided.

Such replacement or addition can take place without interrupting the operation of the apparatus arrangement.

It is particularly favorable in this connection if the circuit-board holder is firmly attached to the cover panel and circuit-board holder and cover panel can be swung out of the housing around a common pivot shaft. In this way, the construction expense is kept small and the installation and removal of circuit boards is still further simplified.

The pivot shaft extends preferably along the lower, approximately horizontal edge of the front-side opening of the housing so that when the board holder is swung out, the cover panel is below the circuit-board holder and does not interfere.

If the plug connections are so arranged on the cover panel that the region thereof which receives the mating plug provided with the lines is directed towards the outside of the housing, then the external terminals can remain connected upon the swinging out of circuit-board holder and cover panel. They are then simply swung out together with the cover panel, without any tension or pressure being exerted on the lines.

A fan unit is preferably arranged on the cover panel, by which fan unit a stream of cooling air which has been drawn in from the outside can be caused to flow through the housing. This is particularly favorable if the fan unit is arranged on the housing inner side of the cover panel while a filter unit is arranged on the side of the cover panel on the outer side of the housing opposite the fan unit. Air can be drawn in by the fan unit from outside the housing through the filter unit and a corresponding passage opening in the connection board. Easy accessibility for replacement of the filter mat of the filter unit is then assured. For this purpose, the filter unit can consist of a rigid, approximately dish-shaped filter grille into the dish of which a filter mat can be inserted in such a manner that it is arranged between the filter grille and the passage opening of the cover panel.

If the filter grille has one or more threaded boreholes into which attachment screws, which are preferably knurled-head screws and which extend through corresponding boreholes in the cover panel can be screwed, then the filter grille can be loosened by simply loosening the knurled nuts and the filter mat can be replaced. Since the threaded bolts extend into the housing, there are no structural parts protruding from the housing towards the outside on which things could catch.

If the cover panel in its closed position has a region which is approximately parallel to the front plane of the housing and developed recessed towards the inside of the housing and on which the plug connections are arranged and if in this connection the recessed region extends also parallel to the plane of the housing by about the length of a mating part, then the mating parts also do not protrude beyond the periphery of the housing. A loosening of the mating pieces by unintentional contact is thus substantially avoided. This, in particular, also in the event that the lines extend laterally from the mating-plug pieces.

If the pivot shaft is in this connection arranged on the rim edge of the recessed region, then a channel results through which the lines can be conducted to other external units without protruding from the housing.

The recessed region can be adjoined by a region of the cover panel which extends approximately in the plane of the housing.

The transition region between the recessed region and the region which extends in the plane of the housing can in this connection be developed in practically countersunk construction as grip trough which can be grasped from behind. The cover panel is particularly easy to manufacture if it consists of a metal plate of appoximately Z-shaped cross section one arm of which forms the recessed region while the other arm forms the region extending in the plane of the housing and the connecting section of which forms the grip trough.

A particularly favorable utilization of the existing structural space is obtained in the manner that the fan unit is arranged in the region of the cover panel which extends in the plane of the housing.

The first circuit board can either be developed, as required, without active electronic components, or active electronic components can be arranged on the first circuit board.

For particularly favorable cooling of the heat-generating electronic components, the housing is developpd with ventilation slits in one region, the circuit boards being arranged between the ventilation slits and the fan unit so that the stream of cooling air always flows along the circuit boards.

If the housing has, in addition to the region which can be closed off by the cover panel, also a drawer region developed with drawer guides and a drawer opening into which electronic devices which close the drawer opening can be inserted, then further units can be arranged in the housing in addition to the circuit boards.

Plug contacts are preferably arranged in the region of the rear wall of the drawer opening, into which plug contacts corresponding mating-plug parts on the rear side of the electronic devices can be inserted in contacting manner by insertion of the electronic devices into the drawer opening. This results in simple installation and removal of the additional units.

The electronic devices can be power-pack modules and/or drives.

If the plug contacts are connected to the first circuit board via electric lines, then a connection can be effected in the region of the pivot shaft so that this connection need not be interrupted upon the swinging out of the circuit-board holder.

BRIEF DESCRIPTION OF THE DRAWINGS

One embodiment is shown in the drawing and will be described in detail below. In the drawing.

DETAILED DESCRIPTION OF THE PREFERRED EMBODIMENTS

The electronic apparatus mounting shown in the figures has a housing 1 which consists of sheet-metal parts which are connected in electrically conductive manner to each other so that a shielding effect is obtained which satisfies the interference protection required.

Figure 2:
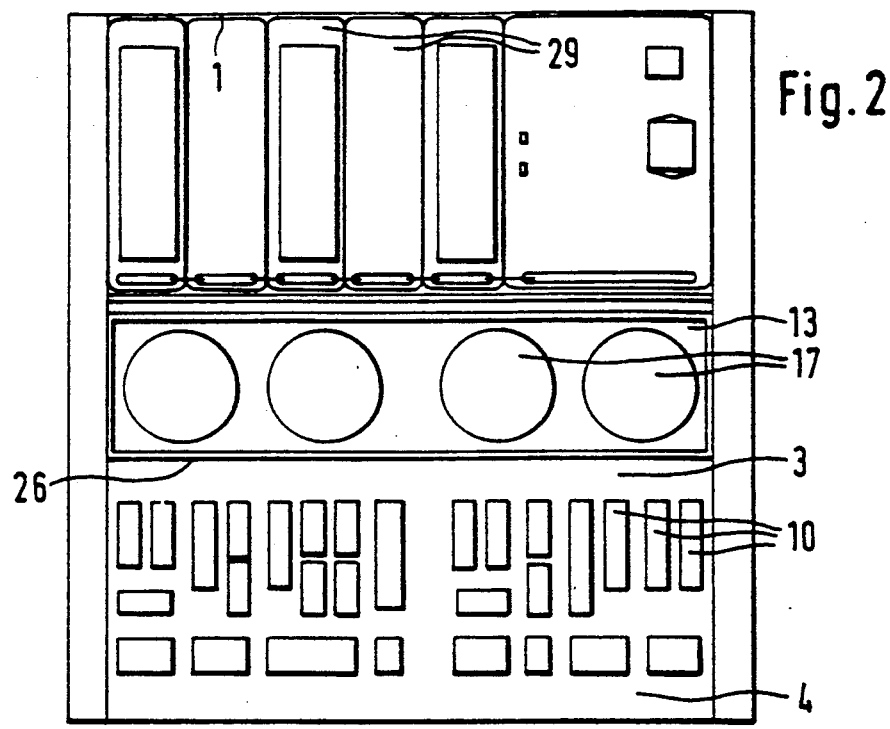
FIG. 2 is a front view of the electronic apparatus mounting of FIG. 1.

The lower region of the housing 1 has a front-side opening 2 which can be closed by a cover panel 3. The cover panel 3 consists of a metal plate of Z-shaped cross section, and includes a portion configured as a lower arm 4 and an upper arm 13, shown also in FIG. 2.

In the closed position of the cover panel, the lower arm 4 is recessed by a certain amount parallel to the front plane of the housing 1.

At its lower end the arm 4 is pivoted to the housing 1 and is swingable around a pivot shaft 5 out of the closed position shown in solid line into the open position shown in dashed line.

A circuit-board holder 6 is firmly attached to the cover panel 3, a first circuit board 7 which, in the closed position, extends approximately parallel to the bottom surface of the housing 1 being attached to the circuit-board holder 6, active electronic components 8 being arranged on the circuit board 7 and additional circuit boards 9 being vertically plugged thereon in electrically conductive manner. The additional circuit boards are held in guides in the circuit-board holder 6 and can be provided with electronic components.

Upon the swinging of the cover panel 3, the circuit-board holder 6 is also at the same time swung together with the circuit boards 7 and 9 so that in the open position the latter are at least substantially outside the housing 1 and can thus be easily replaced or supplemented.

Figure 1:
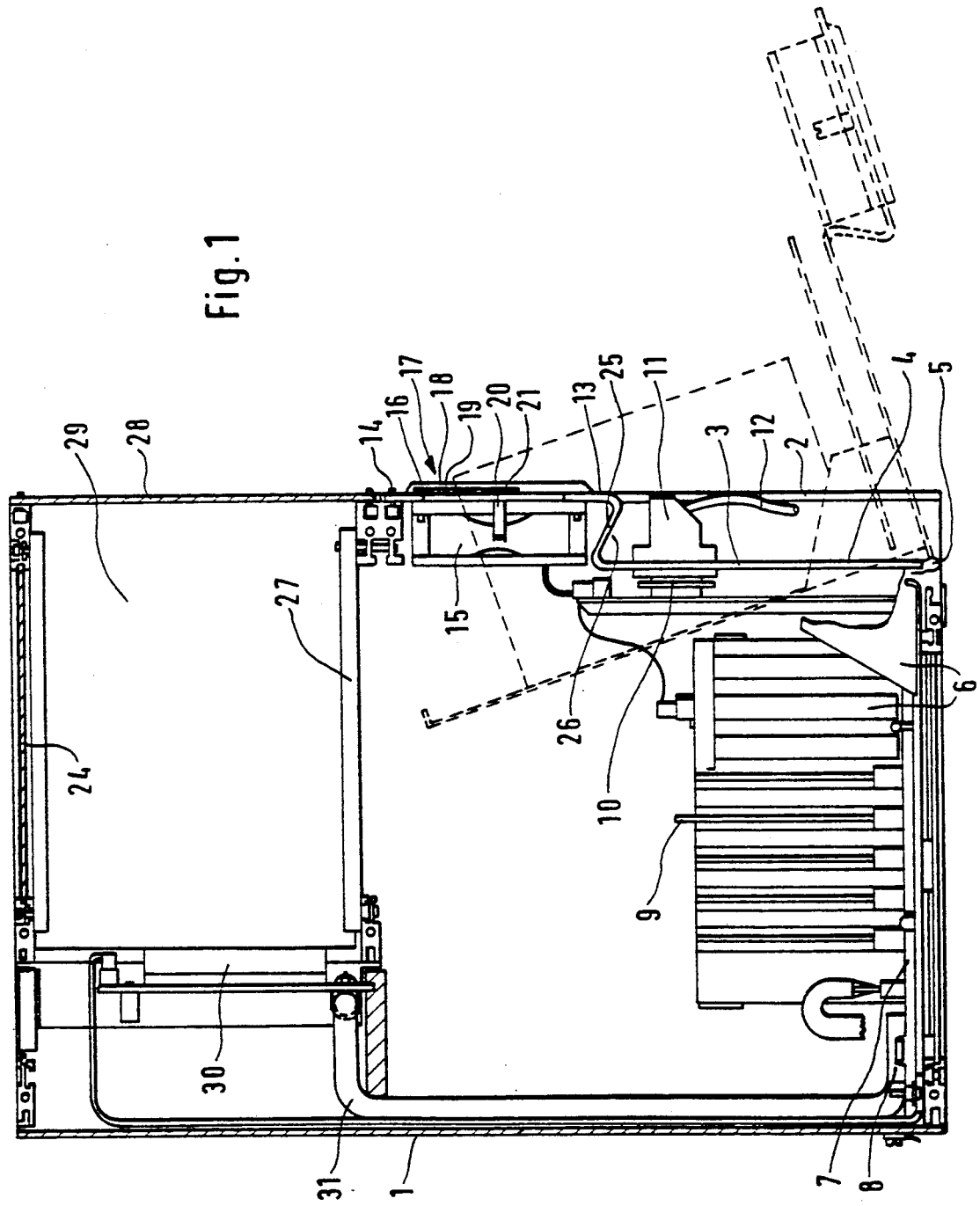
FIG. 1 is a cross section through an electronic apparatus mounting.

On the circuit-board holder 6 and the lower arm 4 of the cover panel 3 there are arranged plug connections 10 (FIGS. 1 and 2) which are directed towards the outside of the housing and are connected by lines or conductor paths to the first circuit board 7 and the contact opening of which extends through a corresponding opening in the lower arm 4. As can be noted on one plug connection 10 shown, a mating-plug piece 11 can be placed thereon from the outside, the mating-plug piece being provided with a lateral branching off of a line 12.

The upper arm 13 of the cover panel 3 extends in closed position approximately in the plane of the housing 1 and can be screwed at its free end of the housing 1 by a screw 14.

In the region of the upper arm 13, fan units 15 are attached on the inner side, the fan units drawing in air from the outside via openings 16 in the cover panel 3 and filter units 17 (FIGS. 1 and 2) arranged on the outer side and blowing it through the housing in order to cool the electronic components.

The filter units 17 consists of a dish-shaped filter grille 18 into the dish of which a filter mat 19 can be inserted in such a manner that it covers the opening 16.

The filter grille 18 has threaded boreholes 20 into which knurled-head screws 21 which are passed through corresponding boreholes in the cover panel 3 can easily be screwed by hand and hold the filter unit 17 in its installed position.

Figure 3:
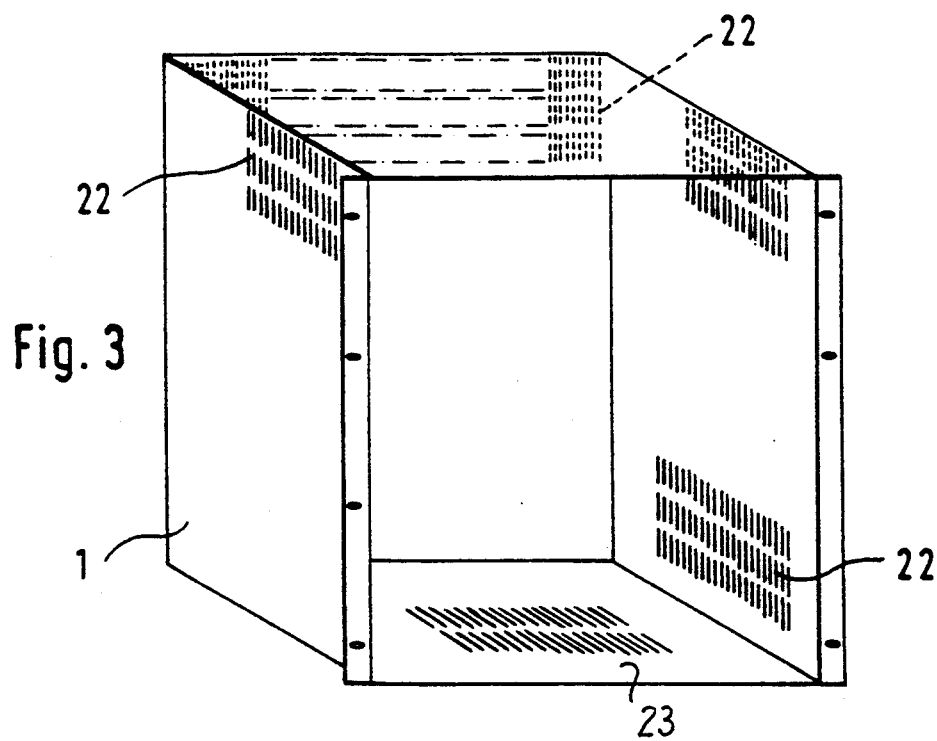
FIG. 3 is a perspective view of the housing of the electronic apparatus mounting of FIG. 1.

The air blown by the fan units 15 into the housing flows out of the fan unit slits 22 (FIG. 3) developed in the side walls and rear wall of the housing and out of the bottom 23 and cover 24 of the housing which have been provided with a perforated plate. The stream of air flowing past the heat-generating electronic components cools the latter.

The connecting web 25 connecting the two arms 4 and 13 forms at the same time a grip trough 26 (FIGS. 1 and 2) by which the cover panel 3 can be grasped for swinging.

Above the region which can be closed by the cover panel 3, the housing 1 has an additional region which is provided with drawer guides 27 and which has, above the opening 2, drawer openings 28 which open towards the outside.

Electronic devices 29 which are provided with mating-plug guide pieces can be so inserted into these drawer openings 28 that in the inserted position their front side closes off the drawer openings 28.

In the region of the rear wall of the drawer openings 28, plug contacts 30 are arranged into which corresponding mating-plug pieces on the rear side of the electronic devices 29 can be inserted in contacting manner.

The plug contacts 30 are connected to the first circuit board 7 via lines 31.

Due to the fact the fan units 15 blow air purified by the filter units 17 into the housing 1, a pressure is built up in the housing 1 which is somewhat higher than that outside the housing. As a result, no impurities can penetrate into the housing 1 through openings and cracks and cause damage to the electronic components.

We claim:

1. A mounting for installation of electronic apparatus in a switchboard or console, said mounting comprising
    a shell-like housing with a front-side opening and a cover panel for closing the opening;
    a plurality of circuit boards for supporting components of said electronic apparatus, said plurality of circuit boards including a first circuit board and at least one additional circuit board;
    wherein said first circuit board is positioned in said housing adjacent to and approximately parallel to a bottom surface of said housing;
    said at least one additional circuit board extends approximately vertically upward from said first circuit board, said additional circuit board being suitable for holding electronic components having plugs for electrical connection to said first circuit board;
    said mounting further comprises a circuit board holder firmly-attached to said cover panel, said first and said additional circuit boards being secured to said circuit-board holder, said holder having plug connections which are connected to said first circuit board in electrically conductive manner for receiving lines which connect to external units;
    a pivot shaft mounted on said housing adjacent to an edge of said front-side opening; and
    wherein said circuit-board holder is swingable with said cover panel about said pivot shaft out from an installed position of said first circuit board in said housing.

2. An electronic apparatus mounting according to claim 1, wherein
    said pivot shaft extends along a lower, approximately horizontal edge of the front-side opening of said housing.

3. An electronic apparatus mounting according to claim 1, wherein
    said plug connections are arranged on said cover panel, there being a region of said cover panel which receives a mating-plug piece provided with said lines to external units, the region of said panel being directed towards the outside of said housing.

4. An electronic apparatus mounting according to claim 1, further comprising
    a fan unit located on said cover panel for drawing a cooling stream of air in from the outside of said housing to flow through said housing.

5. An electronic apparatus mounting according to claim 4, further comprising
    a filter unit located on the outer side of said housing on said cover panel opposite said fan unit; and
    wherein said fan unit is located on the inner side of said housing on said cover panel allowing air to be drawn in by said fan unit from outside said housing through said filter unit, there being a passage opening in said cover panel for air flow.

6. An electronic apparatus mounting according to claim 5, wherein
    said filter unit comprises a rigid, approximately dish-shaped filter grille and a filter mat disposed in a dish of the filter grille; and
    the filter mat is located between the filter grille and the passage opening in the cover panel.

7. An electronic apparatus mounting according to claim 6, wherein
    said filter grille has one or more threaded boreholes, there being boreholes in said cover panel; and
    attachment screws extend through the boreholes of said filter grille and corresponding ones of the boreholes in said cover panel.

8. An electronic apparatus mounting according to claim 7, wherein
    the attachment screws are knurled-head screws.

9. An electronic apparatus mounting according to claim 1, wherein
    in a closed condition, said cover panel has a region which is developed recessed into the inside of said housing, the region of said cover panel being approximately parallel to the front plane of said housing, said plug connections being arranged in said region.

10. An electronic apparatus mounting according to claim 9, further comprising a mating piece disposed at a lower portion of said panel, for mating with a plug of said connections; and wherein
    said recessed region extends parallel to the front plane of said housing by approximately the length of said mating piece.

11. An electronic apparatus mounting according to claim 9, wherein
    said pivot shaft is located at an edge of the recessed region of said cover panel.

12. An electronic apparatus mounting according to claim 9, wherein the recessed region of the cover panel is joined by a further region of the cover panel which extends approximately along a front surface of the housing.

13. An electronic apparatus mounting according to claim 12, wherein
    a transition region between the recessed region of the cover panel and the further region is developed as a grip trough which can be grasped by hand.

14. An electronic apparatus mounting according to claim 13, wherein
    the cover panel comprises a metal plate of approximately Z-shaped cross section including one arm which forms the recessed region, a second arm which forms said further region, and a connecting section which forms the grip trough.

15. An electronic apparatus mounting according to claim 12, further comprising a fan unit located in said further region of the cover panel.

16. An electronic apparatus mounting according to claim 1, wherein
    active electronic components are arranged on said first circuit board.

17. An electronic apparatus mounting according to claim 4, further comprising
    ventilation slots disposed in said housing in one region thereof, the circuit boards being arranged between said one region and said fan unit.

18. An electronic apparatus mounting according to claim 1, further comprising
    a drawer region located in the housing alongside a region which is closable by the cover panel, the drawer region being developed with drawer guides and having a drawer opening for insertion of electronic devices into the housing.

19. An electronic apparatus mounting according to claim 18, further comprising
plug contacts located at a rear wall of the drawer opening; and
wherein the plug contacts at the rear wall receive corresponding mating-plug pieces on the rear of the electronic devices upon an insertion of the electronic devices into the drawer opening.

20. An electronic apparatus mounting according to claim 19, wherein the electronic devices are power-pack modules and/or drives.

21. An electronic apparatus mounting according to claim 19, further comprising electric lines; and
wherein the plug contacts at the rear wall are connected to said first circuit board via said electric lines.

* * * * *